(12) United States Patent
Wallace et al.

(10) Patent No.: US 8,758,040 B2
(45) Date of Patent: Jun. 24, 2014

(54) SYSTEMS AND METHODS FOR ALIGNING AND CONNECTING ELECTRICAL COMPONENTS

(71) Applicant: Eaton Corporation, Cleveland, OH (US)

(72) Inventors: Thomas Alfred Wallace, Raleigh, NC (US); Justin Raymond Hoglund, Wake Forest, NC (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 13/688,868

(22) Filed: Nov. 29, 2012

(65) Prior Publication Data

US 2014/0148043 A1    May 29, 2014

(51) Int. Cl.
*H01R 13/64* (2006.01)

(52) U.S. Cl.
USPC .......................... 439/377; 439/248; 439/378

(58) Field of Classification Search
CPC ................... H01R 23/7005; H01R 13/6315
USPC .................................. 439/377, 248, 247, 378
See application file for complete search history.

(56) References Cited

U.S. PATENT DOCUMENTS

| | | | |
|---|---|---|---|
| 3,447,036 A | | 5/1969 | Dore et al. |
| 5,340,340 A | * | 8/1994 | Hastings et al. ............... 439/64 |
| 5,507,650 A | * | 4/1996 | Larabell ........................ 439/61 |
| 6,385,053 B1 | | 5/2002 | Parizi et al. |
| 7,258,569 B1 | * | 8/2007 | Johnson et al. ............... 439/378 |
| 7,381,081 B2 | * | 6/2008 | Zhang et al. .................. 439/377 |
| 7,402,072 B1 | * | 7/2008 | Chen et al. .................... 439/377 |
| 7,553,182 B2 | * | 6/2009 | Buck et al. .................... 439/378 |
| 7,690,927 B1 | * | 4/2010 | Kerrigan et al. ............... 439/74 |
| 7,903,429 B2 | * | 3/2011 | Fursich et al. ................ 361/802 |
| 8,625,292 B2 | * | 1/2014 | Snider et al. .................. 361/752 |
| 2002/0072268 A1 | * | 6/2002 | Hoelscher et al. ............ 439/374 |
| 2004/0166721 A1 | * | 8/2004 | Hara et al. .................... 439/377 |
| 2005/0146855 A1 | | 7/2005 | Brehm et al. |
| 2009/0068870 A1 | * | 3/2009 | Mezhinsky .................... 439/247 |

OTHER PUBLICATIONS

International Search Report and Written Opinion Corresponding to International Application No. PCT/US2013/067752; Date of Mailing: Feb. 11, 2014; 12 Pages.

* cited by examiner

*Primary Examiner* — Neil Abrams
*Assistant Examiner* — Phuongchi T Nguyen
(74) *Attorney, Agent, or Firm* — Myers Bigel Sibley & Sajovec, P.A.

(57) ABSTRACT

An electrical component assembly includes a first electrical component having a PCB mounted therein. The PCB includes a plurality of female sockets. A second electrical component includes a plurality of PCB engagement members and a plurality of pins. The first and second electrical components each include an alignment feature. The first and second electrical components are configured to be aligned and connected by progressively bringing together the first and second electrical components. In a first position, the first and second electrical components are spaced apart a first distance and the alignment features of the first and second electrical components are engaged. In a second position, the first and second electrical components are spaced apart a second distance and the PCB engagement members engage the PCB. In a third position, the first and second electrical components are spaced apart a third distance and the female sockets receive the pins.

22 Claims, 14 Drawing Sheets

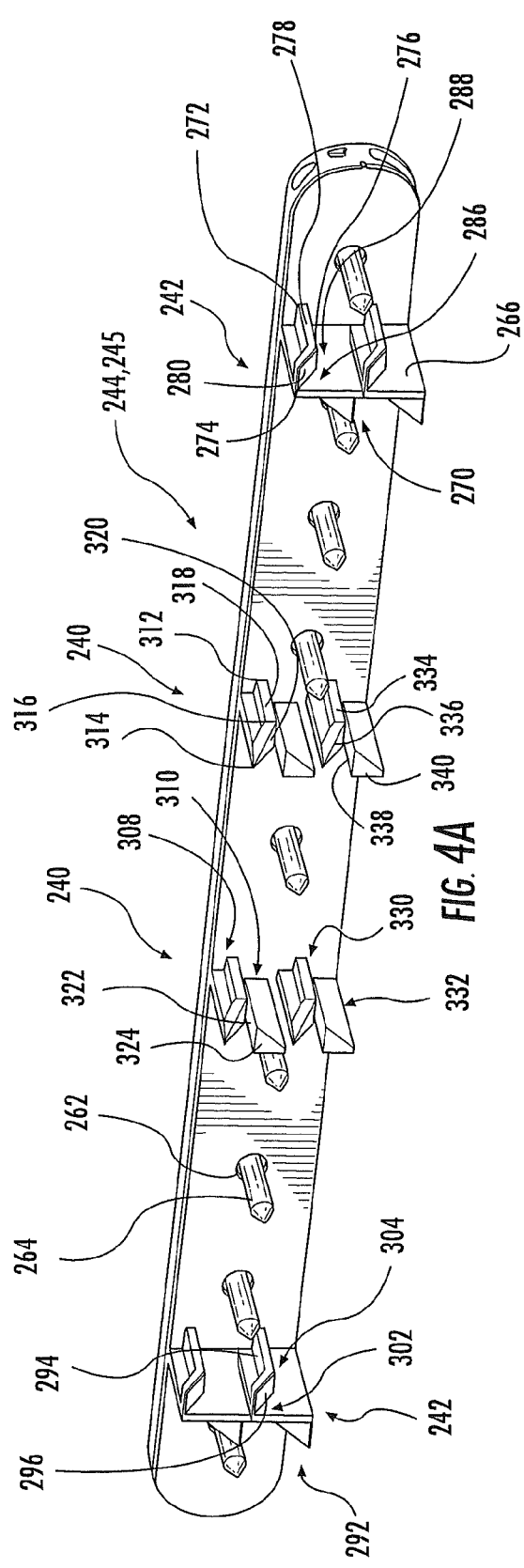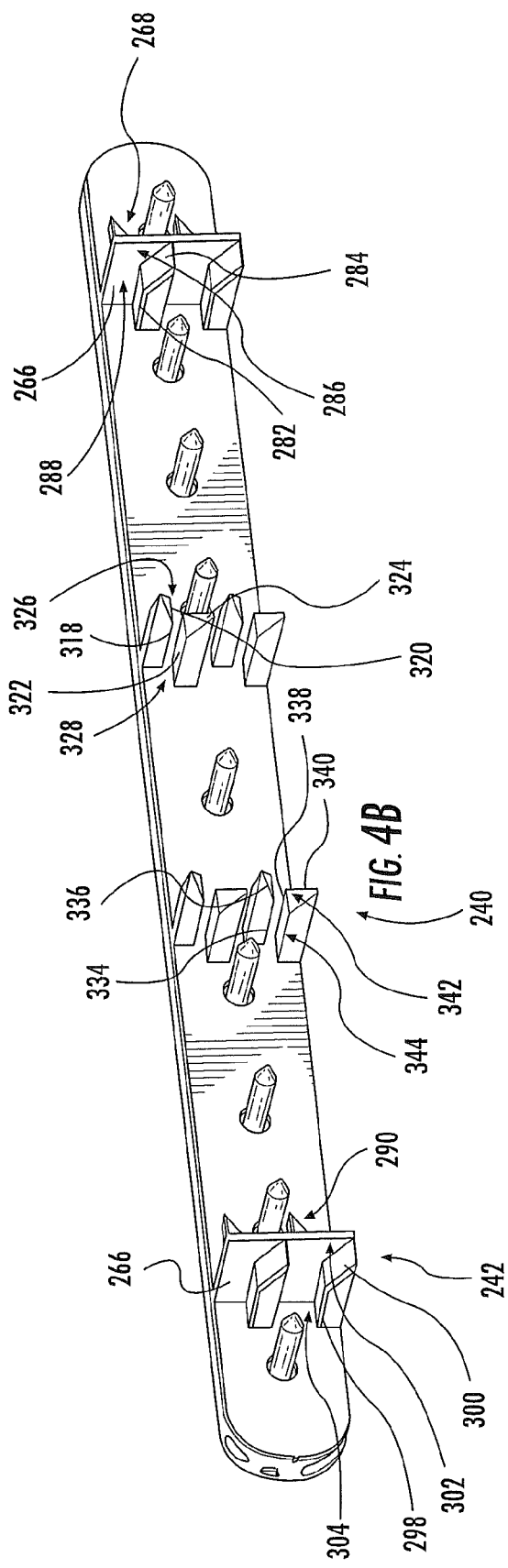

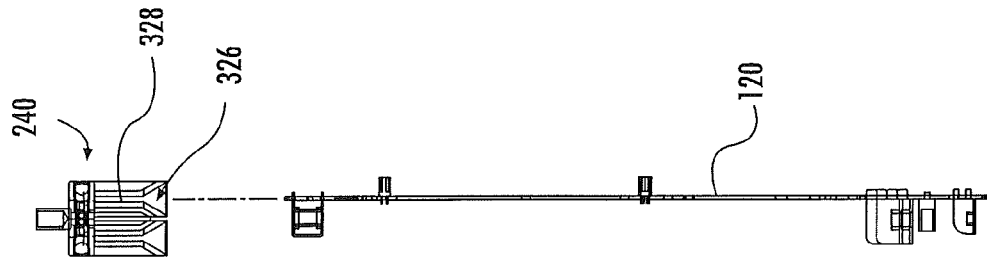
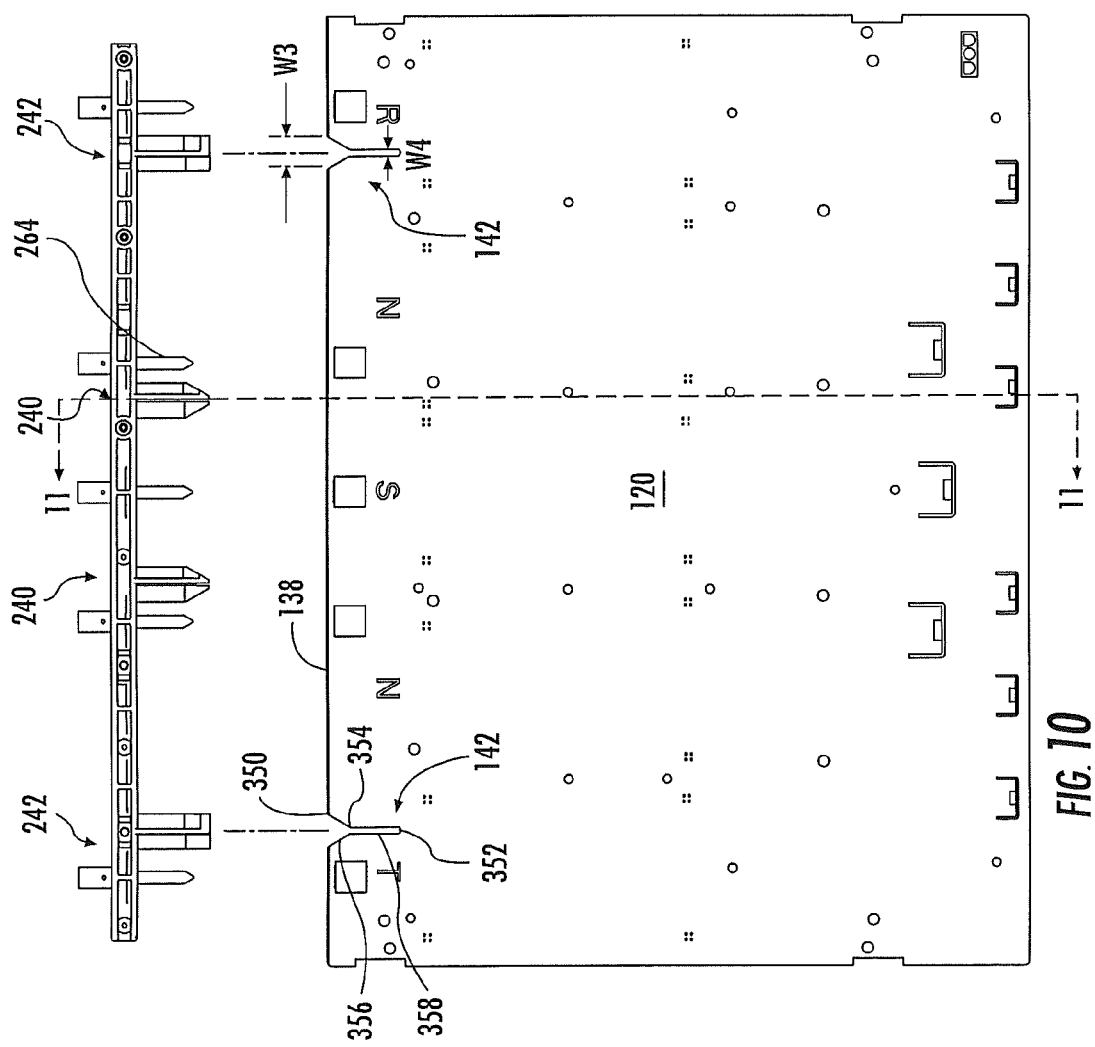

SYSTEMS AND METHODS FOR ALIGNING AND CONNECTING ELECTRICAL COMPONENTS

FIELD OF THE INVENTION

The present invention relates to electrical component systems and methods.

BACKGROUND OF THE INVENTION

Electrical components such as a rectifier/inverter and an inductor box must often be aligned and connected using "blind guidance" due to the geometry of the components and/or the environment in which they are aligned and connected. Further, component tolerance stack-up can lead to frustration in the alignment and connection of such components.

SUMMARY OF THE INVENTION

According to embodiments of the present invention, an electrical component assembly is provided. The assembly includes a first electrical component and a second electrical component. The first electrical component has an engagement end portion and a printed circuit board (PCB) is mounted in the first electrical component. The PCB has an edge at the engagement end portion and a plurality of female sockets positioned adjacent the edge. The first electrical component includes an alignment feature at the engagement end portion. The second electrical component has an engagement end portion with a plurality of PCB engagement members and a plurality of pins at the engagement end portion. The second electrical component includes an alignment feature at the engagement end portion. The first and second electrical components are configured to be aligned and connected by progressively bringing together the engagement end portion of the first electrical component and the engagement end portion of the second electrical component. In a first position, the engagement end portion of the first electrical component and the engagement end portion of the second electrical component are spaced apart a first distance and the alignment features of the first and second electrical components are engaged. In a second position, the engagement end portion of the first electrical component and the engagement end portion of the second electrical component are spaced apart a second distance that is less than the first distance and the PCB engagement members engage the PCB. In a third position, the engagement end portion of the first electrical component and the engagement end portion of the second electrical component are spaced apart a third distance that is less than the second distance and the female sockets receive the pins.

According to some embodiments, the first electrical component alignment feature includes: a plurality of tabs extending outwardly away from a first side portion of the engagement end portion and a plurality of tabs extending outwardly away from a second, opposed side portion of the engagement end portion; and the second electrical component alignment feature comprises a plurality of recesses at a first side portion of the engagement end portion and a plurality of recesses at a second, opposed side portion of the engagement end portion, each recess configured to receive a corresponding tab of the first electrical component. At least one recess on each side portion of the second electrical component engagement end portion may have a width greater than a width of the corresponding tab of the first electrical component; and at least one recess on each side portion of the second electrical component engagement end portion may have a height greater than a height of the corresponding tab of the first electrical component.

According to some embodiments, the PCB engagement members are configured to translate at the engagement end portion in a first direction and in a second direction that is perpendicular to the first direction. The plurality of PCB engagement members may be provided on an elongated member received in a slot at the engagement end portion of the second electrical component, with the elongated member being slidable within the slot. The elongated member may include a plurality of apertures with each of the plurality of pins extending through a respective aperture. Each pin may have a diameter that is less than a diameter of its respective aperture, and each pin may be configured to translate within the aperture, and each pin may be configured to float angularly relative to a front surface of the elongated member.

According to some embodiments, the PCB includes first and second spaced-apart slots extending inwardly from a proximal end at the edge of the PCB to a distal end within the PCB. Each slot includes a first segment having an inwardly tapering opening from the proximal end to an intermediate point between the proximal end and the distal end, and each slot also includes a second segment having substantially constant opening size and extending from the intermediate point to the distal end. The plurality of PCB engagement members includes a first PCB engagement member and a second PCB engagement member. Each one has an elongated rib sized and configured to fit within at least a portion of the second segment of the slot when the first and second electrical components are in the second position. The first segment of each slot may be configured to urge the elongated rib of a respective PCB engagement member into the second segment as the first and second electrical components are moved from the first position to the second position. The first and second PCB engagement members may each include first and second ribs extending away from opposite sides of the elongated rib, with each of the first and second ribs including a flat segment. The first and second PCB engagement members may be configured such that the flat segment of one of the first and second ribs resides on one side of the PCB and the flat segment of the other one of the first and second ribs resides on an opposite side of the PCB when the first and second electrical components are in the second position. Each of the first and second ribs may extend from a proximal end at the engagement end portion of the second electrical component to a distal end, with the flat segment extending from the proximal end to an intermediate point between the proximal and distal ends, and with each of the first and second ribs further including a chamfered segment extending from the intermediate point to the distal end. The first and second ribs may be spaced-apart so as to define a chambered pathway between the chamfered segments and a straight pathway between the flat segments. The first and second ribs may be spaced-apart a substantially constant distance along the straight pathway, with at least a portion of the straight pathway configured to receive the PCB in the second position. The chamfered pathway may be configured to receive the PCB and urge the PCB engagement member into position such that the PCB is received in at least a portion of the straight pathway as the first and second electrical components are moved from the first position to the second position.

According to some embodiments, the plurality of PCB engagement members include a third PCB engagement member positioned between the first and second PCB engagement members, with the third PCB engagement member having first and second ribs configured to receive the PCB therebetween. Each of the first and second ribs of the third PCB engagement member may extend from a proximal end at the engagement end portion of the second electrical component to a distal end, with each rib including a flat segment extending from the proximal end to an intermediate point between the proximal and distal ends, with each rib further including a chamfered segment extending from the intermediate point to the distal end. The first and second ribs of the third PCB engagement member may be spaced-apart so as to define a chamfered pathway between the chamfered segments and a straight pathway between the flat segments, with the first and second ribs being spaced-apart a substantially constant distance along the straight pathway, and at least a portion of the straight pathway configured to receive the PCB in the second position. In the second position, the flat segment of one of the first and second ribs of the third PCB engagement member may reside on one side the PCB and the flat segment of the other one of the first and second ribs may reside on an opposite side of the PCB. The third PCB engagement member chamfered pathway may be configured to receive the PCB and urge the third PCB engagement member into position such that the PCB is received in at least a portion of the straight pathway as the first and second electrical components are moved from the first position to the second position.

According to some embodiments, a first PCB is mounted at a top portion of the first electrical component, with the first PCB including a plurality of female sockets mounted to a bottom surface thereof. A second PCB is mounted at a bottom portion of the first electrical component, with the second PCB including a plurality of female sockets mounted to a top surface thereof. A first elongated member having a plurality of PCB engagement members is slidably mounted in a slot at a top portion of the first electrical component, with the first elongated member including a plurality of apertures with a pin extending through at least some of the apertures. A second elongated member mounted in a slot at a bottom portion of the first electrical component, with the second elongated member including a plurality of apertures with a pin extending through at least some of the apertures. In the second position, the PCB engagement members of the first elongated member engage the first PCB and the PCB engagement members of the second elongated member engage the second PCB. In the third position, the pins extending through the first elongated member are received in the female sockets of the first PCB and the pins extending through the second elongated member are received in the female sockets of the second PCB.

According to method embodiments of the present invention, a method of aligning and connecting electrical components includes providing: a first electrical component having an engagement end portion, the first electrical component including a PCB mounted therein, the PCB having an edge at the engagement end portion and a plurality of female sockets adjacent the edge, the first electrical component including an alignment feature at the engagement end portion; and a second electrical component having an engagement end portion, the second electrical component including a plurality PCB engagement members and a plurality of pins at the engagement end portion, the second electrical component including an alignment feature at the engagement end portion. The method further includes: aligning the first and second electrical components by positioning the engagement end portion of the first electrical component and the engagement end portion of the second electrical component apart a first distance such that the alignment features of the first and second electrical components are engaged with one another; further aligning the first and second electrical components by positioning the engagement end portion of the first electrical component and the engagement end portion of the second electrical component apart a second distance that is less than the first distance such that the PCB engagement members engage the edge of the PCB; and electrically connecting the first and second electrical components by positioning the engagement end portion of the first electrical component and the engagement end portion of the second electrical component apart a third distance that is less than the second distance such that the pins are received in the female sockets.

According to some other embodiments of the present invention, a system for aligning and connecting electrical components is provided. The system includes a first electrical component, a second electrical component and a guidance system for aligning and connecting the first and second electrical components. The first electrical component has an engagement end portion. A PCB is mounted in the first electrical component, with the PCB having an edge at the engagement end portion and a plurality of female sockets adjacent the edge. The second electrical component has an engagement end portion. The guidance system includes a plurality of PCB engagement members and a plurality of pins mounted to an elongated member at the second electrical component engagement end portion, with the elongated member configured to translate at the engagement end portion in a first direction and a second direction that is perpendicular to the first direction, and with each PCB engagement member including a chamfered pathway configured to receive the PCB and urge the PCB engagement member in the first and/or the second direction to substantially align the pins and the female sockets. The guidance system may further include a pair of slots on the PCB, each slot including an inwardly tapering segment at the PCB edge, wherein a first and second of the PCB engagement members each include an elongated rib, the tapering segment of each PCB slot configured to receive the elongated rib of a respective one of the first and second PCB engagement members and urge the PCB engagement member in the first and/or second direction to substantially align the pins and female sockets.

Further features, advantages and details of the present invention will be appreciated by those of ordinary skill in the art from a reading of the figures and the detailed description of the preferred embodiments that follow, such description being merely illustrative of the present invention.

BRIEF DESCRIPTION OF THE DRAWINGS

FIGS. 4A and 4B are side perspective views of an elongated member including PCB engagement members for use with the second electrical component of FIG. 1 according to some embodiments.

FIG. 10 is a schematic, top plan view illustrating a PCB of the first electrical component and PCB engagement members of the second electrical component of FIG. 1.

FIG. 11 is a schematic, cross-sectional view taken along line 11-11 of FIG. 10.

DETAILED DESCRIPTION OF EMBODIMENTS OF THE INVENTION

Figure 1:
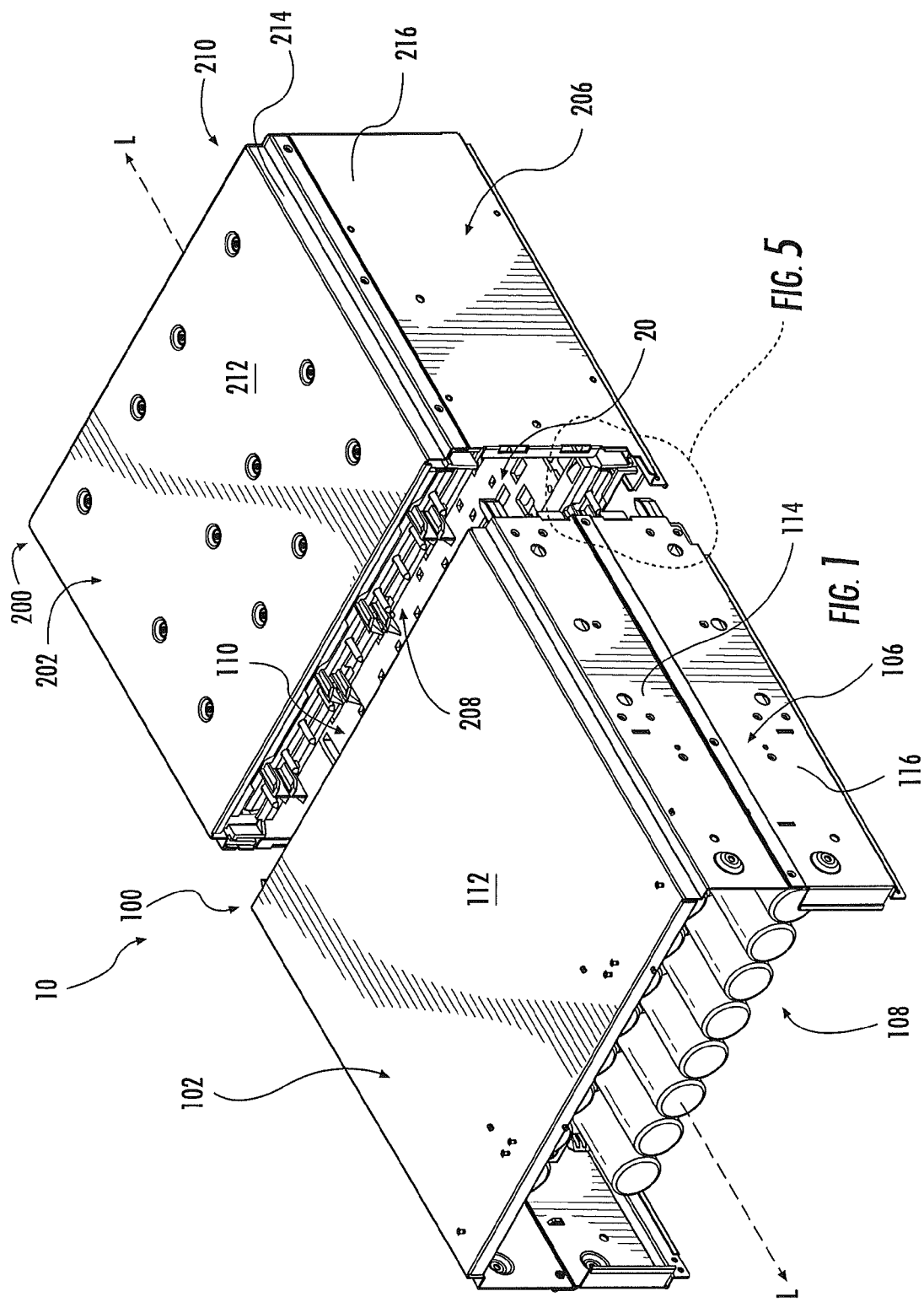
FIG. 1 is an exploded, top perspective view of an electrical component assembly including first and second electrical components according to some embodiments.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the expression "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is noted that any one or more aspects or features described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

As electrical component assembly 10 according to some embodiments is illustrated in FIG. 1. The assembly 10 includes first electrical component 100 and a second electrical component 200. As will be described in detail below, the first and second electrical components 100, 200 are configured to be aligned and/or connected along a longitudinal axis L (or along an axis parallel thereto). A multi-level guidance system 20 may be employed to facilitate the alignment and connection of the first and second electrical components 100, 200. The guidance system 20 will be described in more detail below.

As illustrated, the first electrical component 100 includes a top portion 102, a bottom portion 104, a pair of opposed side portions 106, a front end portion 108 and a rear end portion 110. The rear end portion 110 may also be referred to herein as the engagement end portion 110. The first electrical component 100 includes an enclosure 112. The enclosure 112 may be a "clamshell" type enclosure having an upper portion 114 and a lower portion 116. The enclosure 112 may take other forms; for example, a one-piece enclosure may be provided. The enclosure 112 may be formed of any suitable material and, in some embodiments, is formed of aluminum.

In some embodiments, the first electrical component 100 is a dual rectifier/inverter. In some other embodiments, the first electrical component 100 is a stand-alone rectifier or inverter.

Figure 2:
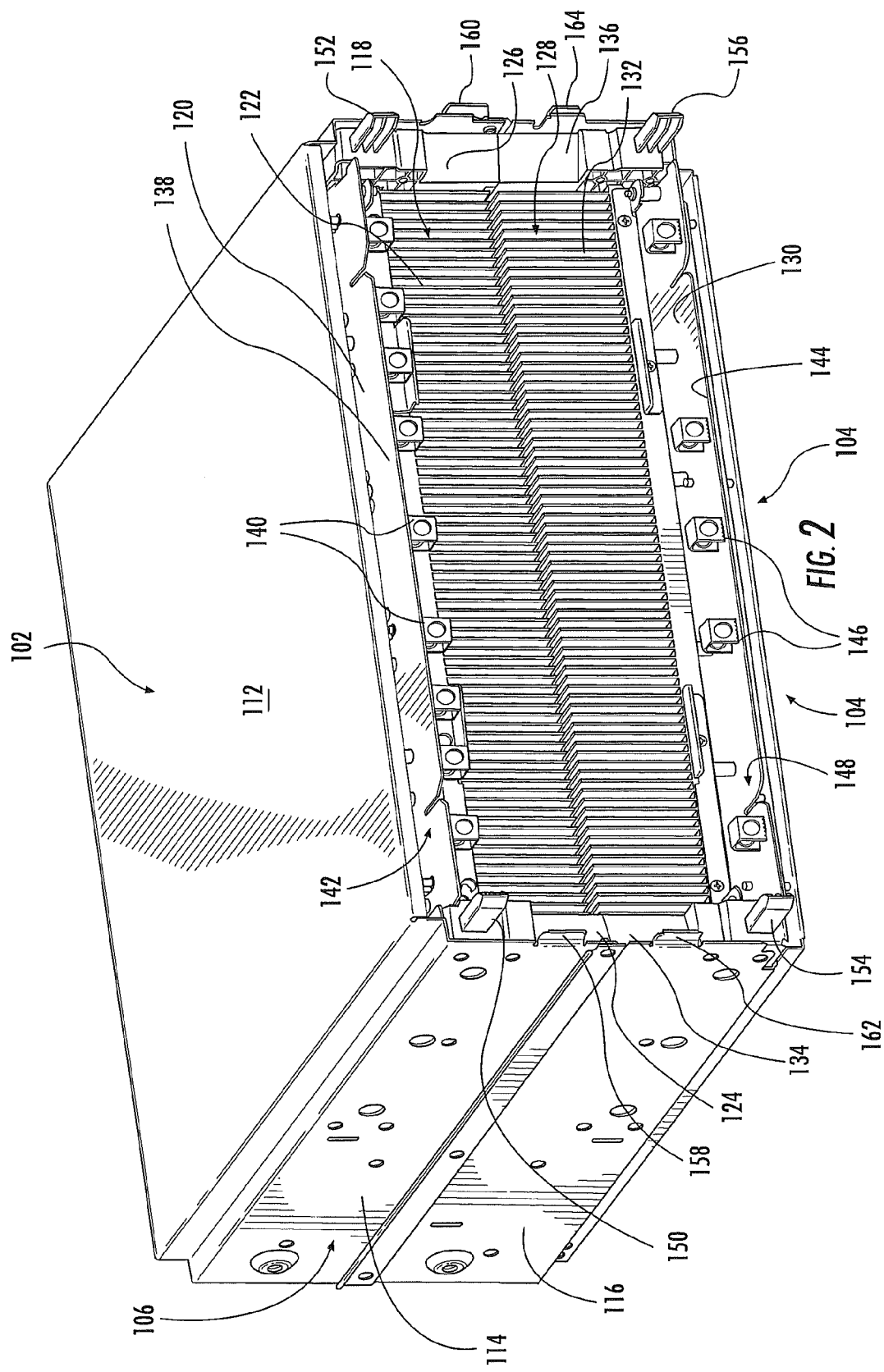
FIG. 2 is a rear perspective view of the first electrical component of FIG. 1.

In the embodiment shown in FIG. 2, a rectifier assembly 118 is provided in the enclosure 112. The rectifier assembly 118 includes a printed circuit board (PCB) 120 mounted to a heat sink assembly 122. The heat sink assembly 122 is held by a pair of end caps 124, 126. The end caps 124, 126 are mounted to the enclosure 112.

An inverter assembly 128 is also provided in the enclosure 112 in the illustrated embodiment. The inverter assembly 128 includes a PCB 130 mounted to a heat sink assembly 132. The heat sink assembly 132 is held by a pair of end caps 134, 136. The end caps 134, 136 are mounted to the enclosure 112.

The end caps 124, 126, 134, 136 may be formed of any suitable material and, in some embodiments, are formed of a polymeric material.

The end caps 124, 134 and a side of the enclosure 112 may collectively form at least a portion of one of the side portions 106 of the first electrical component 100. Similarly, the end caps 126, 136 and an opposite side of the enclosure 112 may collectively form at least a portion of the other one of the side portions 106 of the first electrical component 100.

The PCB 120 has an edge 138 that is positioned at the engagement end portion 110 of the first electrical component 100. A plurality of female sockets 140 are provided on a lower surface of the PCB 120 at or adjacent the edge 138. The female sockets 140 are configured to receive pins to facilitate an electrical connection between the first and second electrical components 100, 200, as described in more detail below. The PCB 120 includes a pair of notches or slots 142 configured to receive PCB engagement members, also as described in more detail below. As illustrated, the PCB 120 is mounted to the heat sink assembly 122 such that the PCB 120 is held in a substantially horizontal orientation within the first electrical component 100. The PCB 120 extends from the edge 138 toward the front end portion 108 of the first electrical component 100.

Similarly, the PCB 130 has an edge 144 that is positioned at the engagement end portion 110 of the first electrical component 100. A plurality of female sockets 146 are provided on an upper surface of the PCB 130 at or adjacent the edge 144. The female sockets 146 are configured to receive pins to facilitate an electrical connection between the first and second electrical components 100, 200, as described in more detail below. The PCB 130 includes a pair of notches or slots 148 configured to receive PCB engagement members, also as described in more detail below. As illustrated, the PCB 130 is mounted to the heat sink assembly 132 such that the PCB 130 is held in a substantially horizontal orientation within the first electrical component 100. The PCB 130 extends from the edge 144 toward the front end portion 108 of the first electrical component 100.

The engagement end portion 110 of the first electrical component 100 includes a first alignment feature used to provide "first level" alignment or guidance, as will be described in more detail below. In the illustrated embodiment, the first alignment feature includes a tab 150 extending from the end cap 124, a tab 152 extending from the end cap 126, a tab 154 extending from the end cap 134 and a tab 156 extending from the end cap 136. The tabs 150, 152, 154, 156 extend outwardly away from the engagement end portion 110 of the first electrical component 100. The first alignment feature may also include tabs 158, 160 extending from the enclosure 112 (e.g., the enclosure upper portion 114) and tabs 162, 164 extending from the enclosure 112 (e.g., the enclosure lower portion 116). The tabs 158, 160, 162, 164 extend outwardly away from the engagement end portion 110 of the first electrical component 100. The tabs 150, 154, 158, 162 are provided at one of the side portions 106 of the first electrical component; the tabs 152, 156, 160, 164 are provided at the other one of the side portions 106 of the first electrical component. It is contemplated that the first alignment feature of the first electrical component 100 may include a greater or lesser number of tabs.

Figure 3:
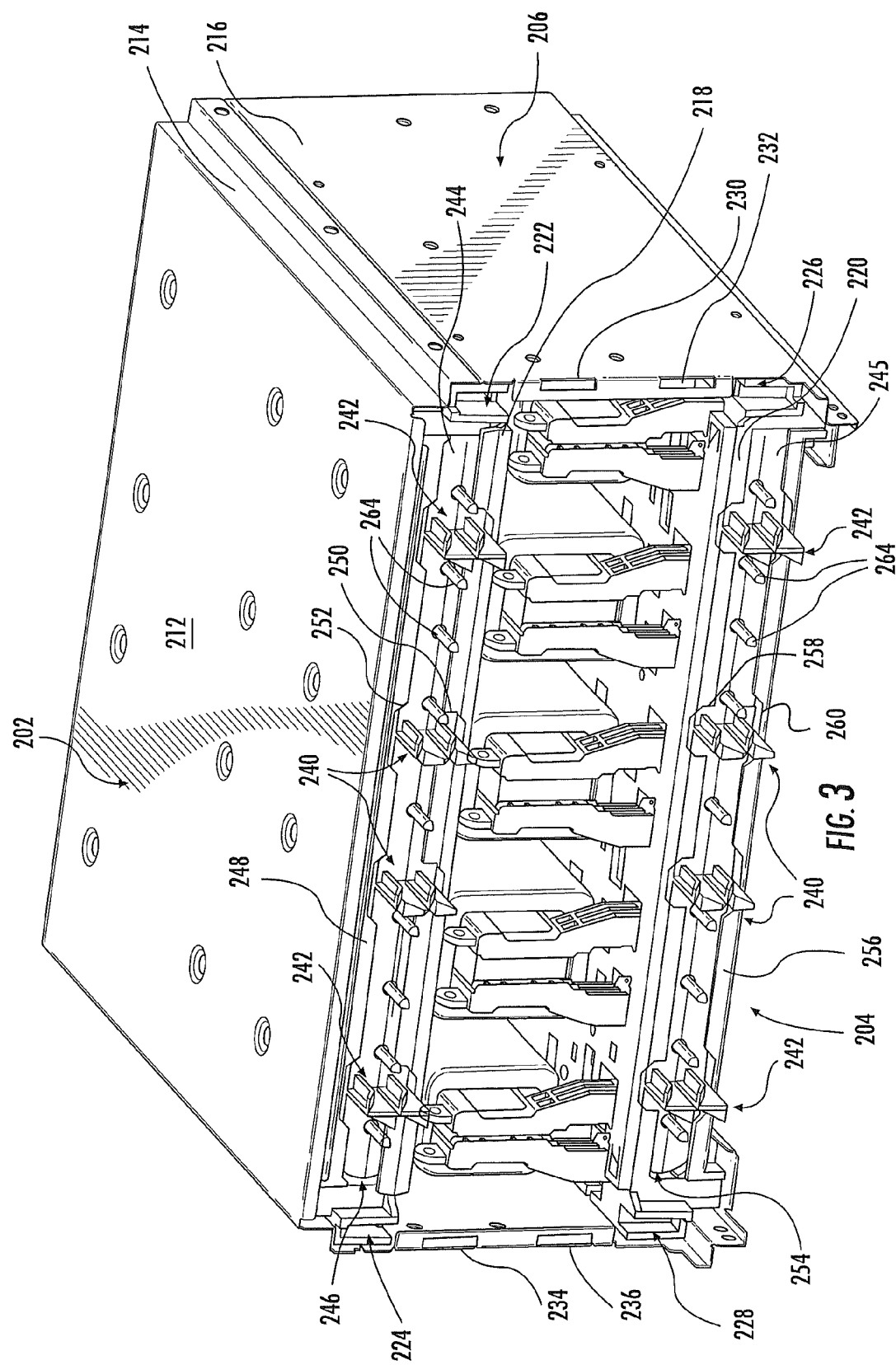
FIG. 3 is a front perspective view of the second electrical component of FIG. 1.

Referring to FIGS. 1 and 3, a second electrical component 200 according to some embodiments is illustrated. The second electrical component 200 includes a top portion 202, a bottom portion 204, a pair of opposed side portions 206, a front end portion 208 and a engagement end portion 210. The front end portion 208 may be referred to herein as the engagement end portion 208. The second electrical component 200 includes an enclosure 212. The enclosure 212 may be a "clamshell" type enclosure having an upper portion 214 and a lower portion 216. The enclosure 212 may take other forms; for example, a one-piece enclosure may be provided. The enclosure 212 may be formed of any suitable material and, in some embodiments, is formed of aluminum.

In some embodiments, the second electrical component 200 includes one or more inductors and, in some embodiments, is an inductor box.

In the embodiment shown in FIG. 3, an upper inductor support plate 218 is mounted to the enclosure 212 (e.g., at the enclosure upper portion 214) and a lower inductor support plate 220 is mounted to the enclosure 212 (e.g., at the enclosure lower portion 216). The inductor support plates 218, 220 may be formed of any suitable material and, in some embodiments, are formed of a polymeric material.

The upper inductor support plate 218 is positioned at the upper portion 202 of the second electrical component 200 and the lower inductor support plate 220 is positioned at the lower portion 204 of the second electrical component 200.

The engagement end portion 208 of the second electrical component 200 includes a second alignment feature used to provide "first level" alignment or guidance, as will be described in more detail below. In the illustrated embodiment, the second alignment feature includes recesses 222, 224 formed in the upper inductor support plate 218 and recesses 226, 228 formed in the lower inductor support plate 220. Each of the recesses 222, 224, 226, 228 is configured to receive a respective one of the tabs 150, 152, 154, 156 (FIG. 2). The second alignment feature may also include recesses 230, 232, 234, 236 formed in the enclosure 212 (e.g., the enclosure lower portion 216). Each of the recesses 230, 232, 234, 236 is configured to receive a respective one of the tabs 158, 160, 162, 164 (FIG. 2). The recesses 222, 226, 230, 232 are provided at one of the side portions 206 of the second electrical component 200 and the recesses 224, 228, 234, 236 are provided at the other one of the side portions 206 of the second electrical component 200.

It is contemplated that the second alignment feature of the second electrical component 200 may include a greater or lesser number of recesses (with the first electrical component 100 including a corresponding greater or lesser number of tabs). Also, other configurations for the alignment features of the first and second electrical components 100, 200 are contemplated. As just one example, the first electrical component 100 may include recesses and the second electrical component 200 may include tabs.

The engagement end portion 208 of the first electrical component 200 also includes a plurality of PCB engagement members configured to engage the PCBs 120, 130 to provide "second level" alignment or guidance, as will be described in more detail below. As illustrated, a pair of PCB engagement members 240 and a pair of PCB engagement members 242 are provided on an elongated member 244 that is received within a slot 246 of the upper inductor support plate 218 (i.e., at the top portion 202 of the second electrical component 200). A greater or lesser number of the PCB engagement members 240 and/or the PCB engagement members 242 may be provided. An elongated retainer member 248 may be provided to retain the elongated member 244 in the slot 246. The elongated retainer member 248 may be mounted to the enclosure 212 and/or the upper inductor support plate 218. The elongated member 244 may be slidable within the slot 246 such that the PCB engagement members 240, 242 may "float" or translate horizontally (e.g., relative to the second electrical component side portions 206) and vertically (e.g., relative to the second electrical component top and bottom portions 202, 204). Recesses 250 in the upper inductor support plate 218 and recesses 252 in the retainer member 248 may be provided to facilitate, as well as limit, such translation.

The PCB engagement members 240 are configured to engage an upper and a lower surface of the PCB 120 (FIG. 2), as will be described in more detail below. The PCB engagement members 242 are configured to engage the notches or slots 142 of the PCB 120 (FIG. 2) as well as the upper and lower surfaces of the PCB 120, also as described in more detail below.

Similarly, a pair of PCB engagement members 240 and a pair of PCB engagement members 242 are provided on an elongated member 245 that is received within a slot 254 of the lower inductor support plate 220. An elongated retainer member 256 may be provided to retain the elongated member 244 in the slot 254. The elongated retainer member 256 may be mounted to the enclosure 212 and/or to the lower inductor support plate 220. The elongated member 244 may be slidable within the slot 254 such that the PCB engagement members 240, 242 may float or translate horizontally (e.g., relative to the second electrical component side portions 206) and vertically (e.g., relative to the second electrical component top and bottom portions 202, 204). Recesses 258 in the lower inductor support plate 220 and recesses 260 in the retainer member 256 may be provided to facilitate, as well as limit, such translation.

The PCB engagement members 240 are configured to engage an upper and a lower surface of the PCB 130 (FIG. 2), as will be described in more detail below. The PCB engagement members 242 are configured to engage the notches or slots 148 of the PCB 130 (FIG. 2) as well as the upper and lower surfaces of the PCB 130, also as described in more detail below.

The elongated members 244, 245 may be identical or substantially identical. An exemplary elongated member 244 is shown in greater detail in FIGS. 4A and 4B. The elongated member 244 includes a plurality of apertures 262, with each aperture 262 configured to receive a pin 264 therethrough. The female sockets 140, 146 associated with the PCBs 120, 130 (FIG. 2) are configured to receive the pins 264 to provide "third level" alignment, connection or guidance, as described in greater detail below.

Each PCB engagement member 242 includes an elongated or vertical rib 266. Each PCB engagement member 242 also includes a first rib 268 and a second rib 270, one each extending away from an opposite side of the vertical rib 266. With reference to the first rib 268 shown in FIG. 4A, each of the ribs 268, 270 extends from a proximal end 272 at the elongated member 244 to a distal end 274, with an intermediate point 276 located therebetween. The rib 268 includes a flat segment 278 extending from the proximal end 272 to the intermediate point 276 and a chamfered segment 280 extending from the intermediate point 276 to the distal end 274. The second rib 270 includes a similar flat segment 282 and chamfered segment 284.

The first and second ribs 268, 270 are spaced-apart (e.g., vertically spaced-apart) to form pathways through which the PCBs may be received. As illustrated, the first and second rib chamfered segments 280, 284 together form a chamfered or lead-in pathway 286. Specifically, the chamfered pathway 286 is positioned below the chamfered segment 280 of the first rib 268 and above the chamfered segment 284 of the second rib 270. Also as illustrated, the first and second rib flat segments 278, 282 together form a straight pathway 288. Specifically, the straight pathway 288 is positioned below the flat segment 278 of the first rib 268 and above the flat segment 282 of the second rib 270.

Each PCB engagement member 242 may also include third rib 290 and a fourth rib 292, one each extending away from an opposite side of the vertical rib 266. Similar to the first rib 268, the third rib 290 includes a flat segment 294 and a chamfered segment 296. Similar to the second rib 270, the fourth rib 292 also includes a flat segment 298 and a chamfered segment 300.

Like the first and second ribs 268, 270, the third and fourth ribs 290, 292 are spaced-apart (e.g., vertically spaced-apart) to form pathways through which the PCBs may be received. As illustrated, the third and fourth rib chamfered segments 296, 300 together form a chamfered or lead-in pathway 302. Specifically, the chamfered pathway 302 is positioned below the chamfered segment 296 of the third rib 290 and above the chamfered segment 300 of the fourth rib 292. Also as illustrated, the third and fourth rib flat segments 294, 298 together form a straight pathway 304. Specifically, the straight pathway 304 is positioned below the flat segment 294 of the third rib 290 and above the flat segment 298 of the fourth rib 292.

It will be appreciated that the provision of four ribs 268, 270, 290, 292 and as a result a pair of pathways for each PCB engagement member 242 allows for the elongated member 244 to be used in connection with each of the PCBs 120, 130 (FIG. 2). As shown in FIGS. 4A and 4B, the pins 264 are generally aligned in a row between or adjacent the second rib 270 and the third rib 290. As such, with the PCB 120 having the female sockets 140 positioned on a lower surface of the PCB 120 or "below" the PCB 120, the PCB 120 may be received in the chamfered pathway 286 and the straight pathway 288 such that the pins 264 may be received by the female sockets 140. Also, with the PCB 130 having the female sockets 146 positioned on an upper surface of the PCB 130 or "above" the PCB 130, the PCB 130 may be received in the chamfered pathway 302 and the straight pathway 304 such that the pins 264 may be received by the female sockets 146.

Still referring to FIGS. 4A and 4B, each PCB engagement member 240 includes first and second ribs 308, 310. With reference to the first rib 308 shown in FIG. 4A, each of the ribs 308, 310 extends from a proximal end 312 at the elongated member 244 to a distal end 314, with an intermediate point 316 located therebetween. The rib 308 includes a flat segment 318 extending from the proximal end 312 to the intermediate point 316 and a chamfered segment 320 extending from the intermediate point 316 to the distal end 314. The second rib 310 includes a similar flat segment 322 and chamfered segment 324.

The first and second ribs 308, 310 are spaced-apart (e.g., vertically spaced-apart) to form pathways through which the PCBs may be received. As illustrated, the first and second rib chamfered segments 320, 324 together form a chamfered or lead-in pathway 326. Specifically, the chamfered pathway 326 is positioned below the chamfered segment 320 of the first rib 308 and above the chamfered segment 324 of the second rib 310. Also as illustrated, the first and second rib flat segments 318, 322 together form a straight pathway 328. Specifically, the straight pathway 328 is positioned below the flat segment 318 of the first rib 308 and above the flat segment 322 of the second rib 310.

Each PCB engagement member 240 may also include third and fourth ribs 330, 332. Similar to the first rib 308, the third rib 330 includes a flat segment 334 and a chamfered segment 336. Similar to the second rib 310, the fourth rib 332 also includes a flat segment 338 and a chamfered segment 340.

Like the first and second ribs 308, 310, the third and fourth ribs 330, 332 are spaced-apart (e.g., vertically spaced-apart) to form pathways through which the PCBs may be received. As illustrated, the third and fourth rib chamfered segments 336, 340 together form a chamfered or lead-in pathway 342. Specifically, the chamfered pathway 342 is positioned below the chamfered segment 336 of the third rib 330 and above the chamfered segment 340 of the fourth rib 332. Also as illustrated, the third and fourth rib flat segments 334, 338 together form a straight pathway 344. Specifically, the straight pathway 344 is positioned below the flat segment 334 of the third rib 330 and above the flat segment 338 of the fourth rib 332.

It will be appreciated that the provision of four ribs 268, 270, 290, 292 and as a result a pair of pathways for each PCB engagement member 240 may provide the same advantages described above in connection with the PCB engagement member 242.

The above-described features of the first and second electrical components 100, 200 facilitate multi-level or multi-stage alignment, guidance and/or connection systems and methods. According to some embodiments, the alignment, guidance and connection process is performed in three stages. The first and second electrical components 100, 200 may be progressively brought or moved together or converged from a first position to a second position and finally to a third position. In the first position, the first electrical component engagement end portion 110 is positioned a first distance from the second electrical component engagement end portion 208. In the second position, the first electrical component engagement end portion 110 is positioned a second distance from the second electrical component engagement end portion 208, with the second distance being less than the first distance. In the third position, the first electrical component engagement end portion 110 is positioned a third distance from the second electrical component engagement end portion 208, with the third distance being less than the second distance. In some embodiments, the first electrical component engagement end portion 110 abuts the second electrical component engagement end portion 208 in the third position.

Figure 5:
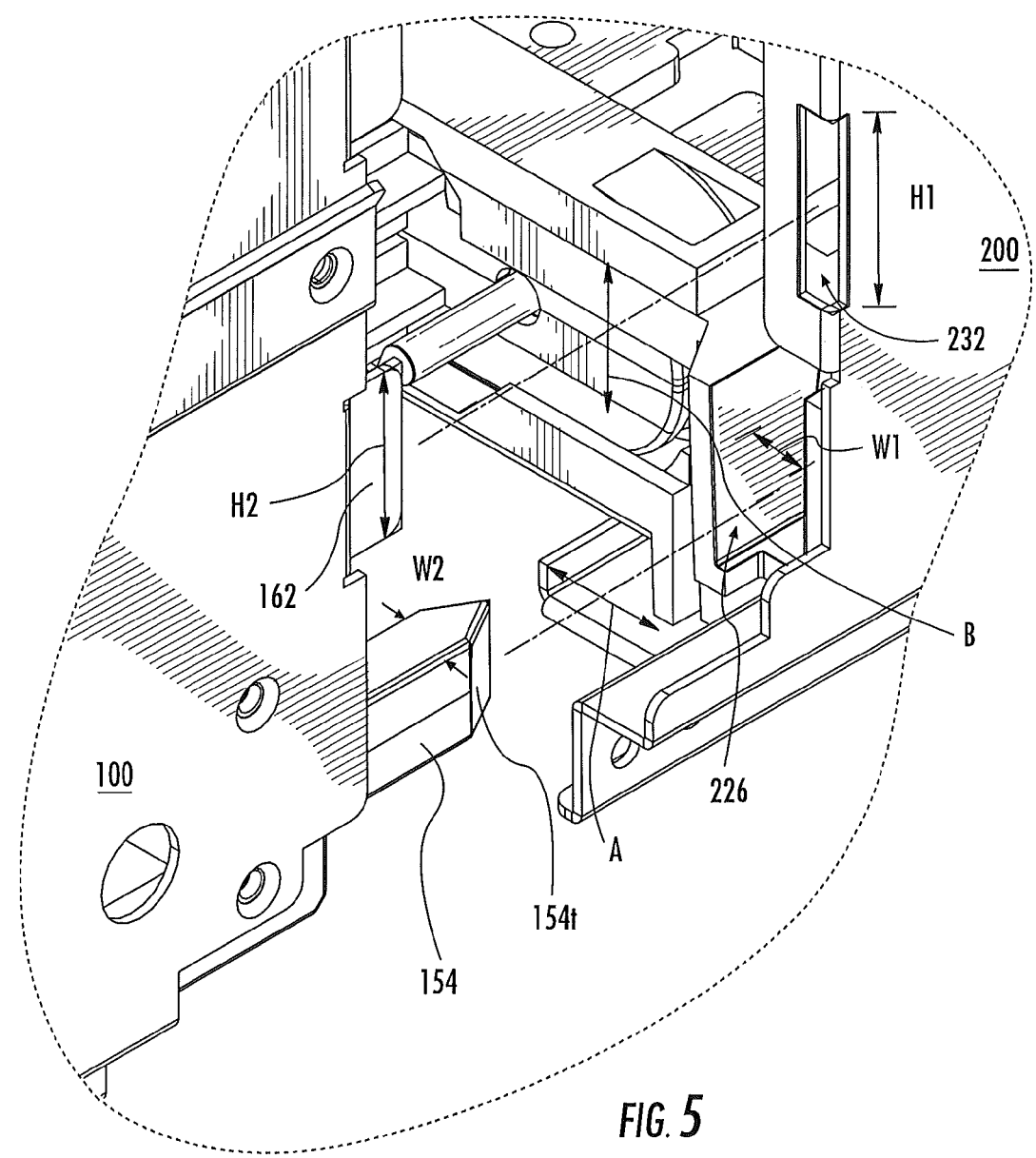
FIG. 5 is an enlarged, fragmentary, side perspective view of the first and second electrical components of FIG. 1 illustrating alignment features thereof.

The first and second electrical components 100, 200 may be first brought together such that their respective alignment features engage with one another. This is exemplified in FIG. 5, wherein the tab 154 is received in the recess 226 and the tab 162 is received in the recess 232. As illustrated, the "longer" tab 154 includes a tapered tip portion 154t to facilitate insertion into the recess 226. At least some of the other tabs associated with the first electrical component 100 may share this feature; for example, as shown in FIG. 2, the tabs 150, 152 and 156 also include tapered tip portions.

The recess 226 may have a width W1 that is greater than a width W2 of the tab 154. As such, when the tab 154 is engaged with the recess 226, the width differential allows for limited horizontal relative movement of the electrical components 100, 200 as shown by the arrow A. The recess 232 may have a height H1 that is greater than a height H2 of the tab 162. Thus, when the tab 162 is engaged with the recess 232, the height differential allows for limited vertical relative movement of the electrical components 100, 200 as shown by the arrow B.

The height and/or width differentials of various tabs and their corresponding recesses may vary. For example, height and/or width differentials associated with the tabs 150, 158 (FIG. 2) and corresponding recesses 222, 230 (FIG. 3) may be greater than the height and/or width differentials associated with the tabs 154, 162 and the recesses 226, 232. This may be due to the tabs having smaller dimensions and/or the recesses having larger dimensions.

Figure 6:
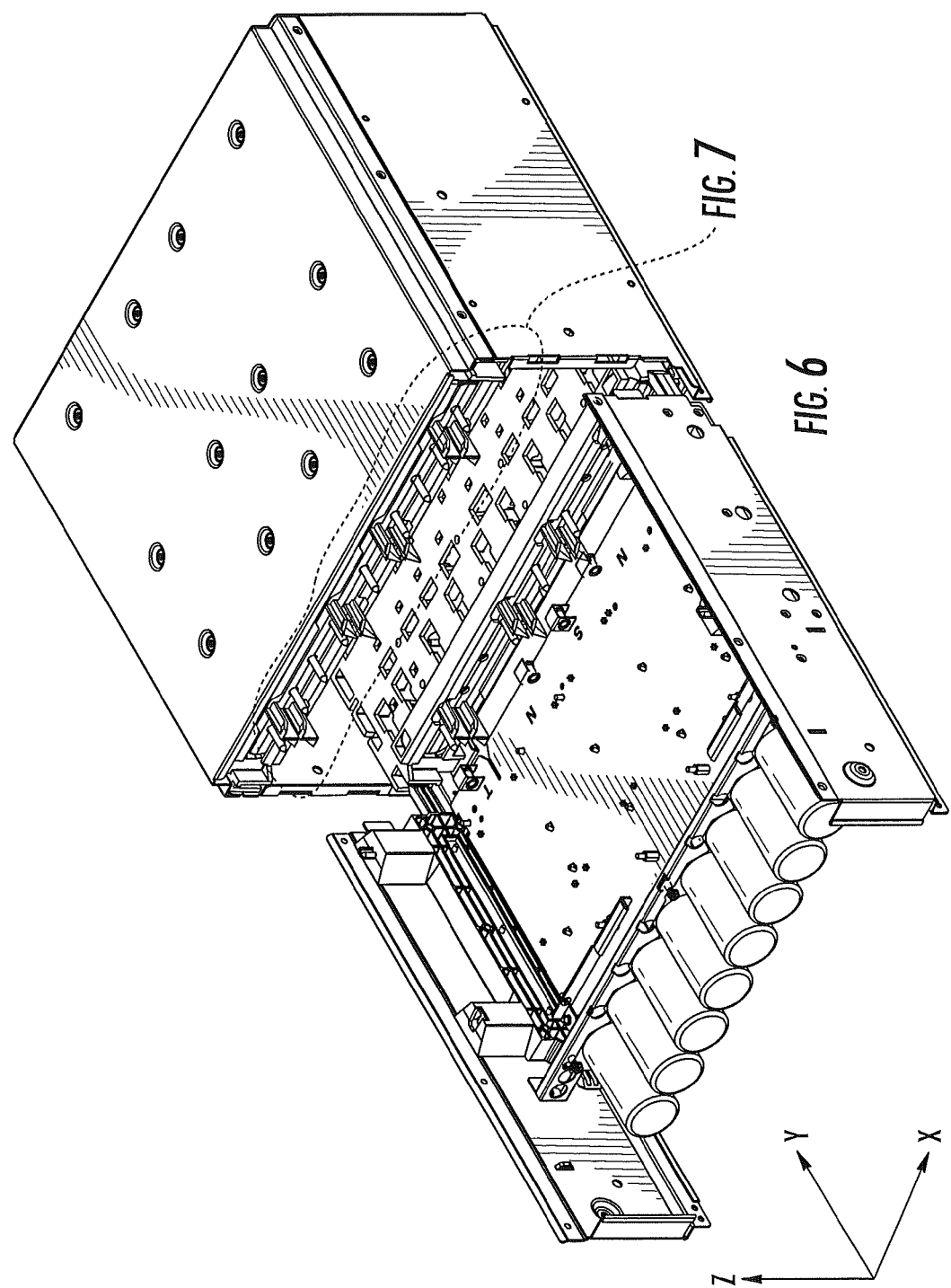
FIG. 6 is a partially transparent, top perspective view of the first and second electrical components of FIG. 1.
Figure 7:
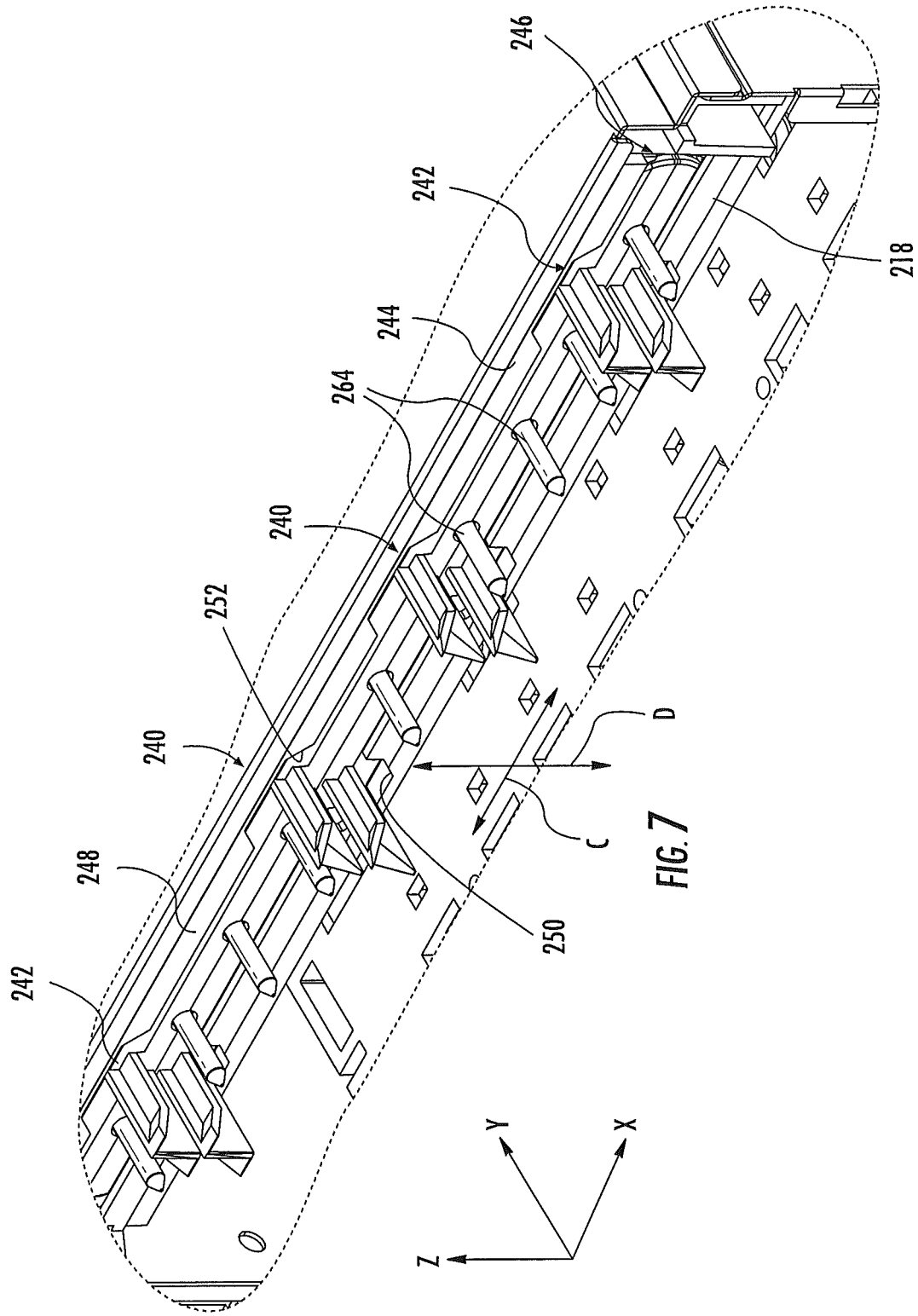
FIG. 7 is an enlarged, fragmentary, side perspective view of a portion of the second electrical component as indicated in FIG. 6.
Figure 8:
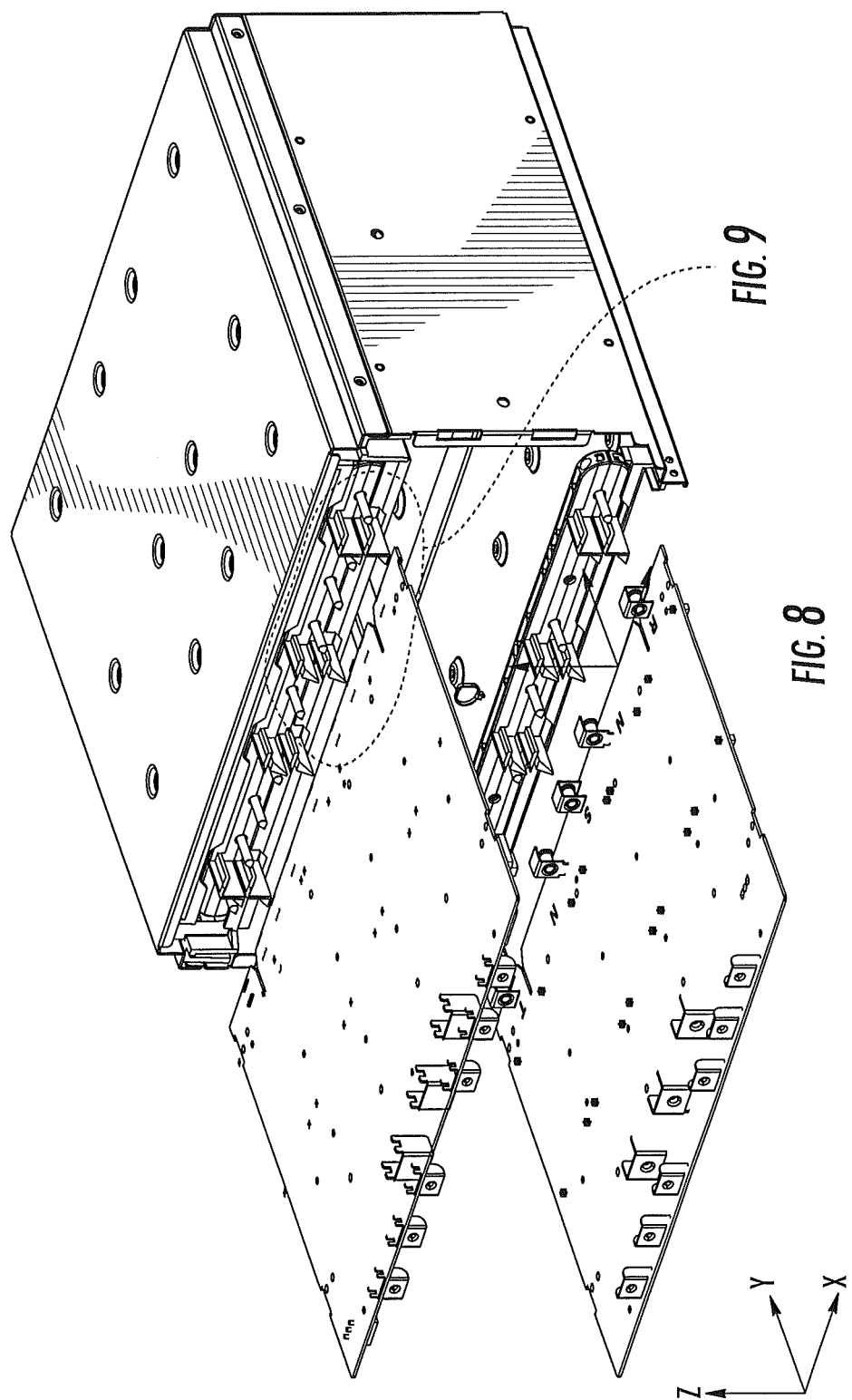
FIG. 8 is a partially transparent, top perspective view of the first and second electrical components of FIG. 1.

Again, in the first level or during the first stage of guidance, the alignment features of the first and second electrical components 100, 200 are engaged with one another, and limited horizontal and vertical relative movement is provided. The first and second electrical components 100, 200 may be generally aligned and somewhat constrained, but with flexibility provided for further alignment. FIGS. 6-13 illustrate various aspects associated with the second level or stage of guidance, wherein the PCB engagement members engage the PCBs. Referring to FIGS. 6 and 7, and as noted above, the elongated member 244 from which the PCB engagement members 240, 242 extend can be slidably received in the slot 246 defined in the first inductor support plate 218. As such, the PCB engagement members 240, 242 as well as the pins 264 extending through the horizontal member 244 may float or translate horizontally, as shown by the arrow C, as well as vertically, as shown by the arrow D (FIG. 7). More generally, the PCB engagement members 240, 242 may float or translate in a direction C that is transverse to the longitudinal axis L (FIG. 1). The PCB engagement members 240, 242 may also float or translate in a direction D that is transverse to the longitudinal axis L (FIG. 1) and perpendicular to the direction C. Each PCB engagement member 240, 242 extends through one of the recesses 250 of the first inductor mounting plate 218 and one of the recesses 252 of the retaining member 248 to thereby control the degree of translational movement. The floating or translational movement of each PCB engagement member 240, 242 may allow for easier guidance of the PCB into the chamfered and straight pathways of each PCB engagement member 240, 242, and ultimately proper alignment of the pins and female sockets, as described in more detail below.

Turning to FIGS. 8-11, geometrical features of the PCB engagement members 240, 242 as well as the PCBs 120, 130, along with the ability of the PCB engagement members 240, 242 to "float" horizontally and vertically, facilitate the second level guidance wherein the PCB engagement members 240, 242 engage the PCBs 120, 130. Referring to FIG. 10, the notches or slots 142 of the PCB 120 extend inwardly from the PCB edge 138. The slots 142 each have a proximal end 350 at the PCB edge 138 and a distal end 352, with an intermediate point 354 located therebetween. Each slot 142 has an opening size or width W3 at the proximal end 352 and an opening size or width W4 at the distal end 352. Each slot 142 includes a first tapered segment 356 having decreasing opening size or width from the proximal end 350 to the intermediate point 354. Each slot also includes a second segment 358 extending from the intermediate point 354 to the distal end 352 and having a constant or substantially constant opening size or width W4.

Figure 9:
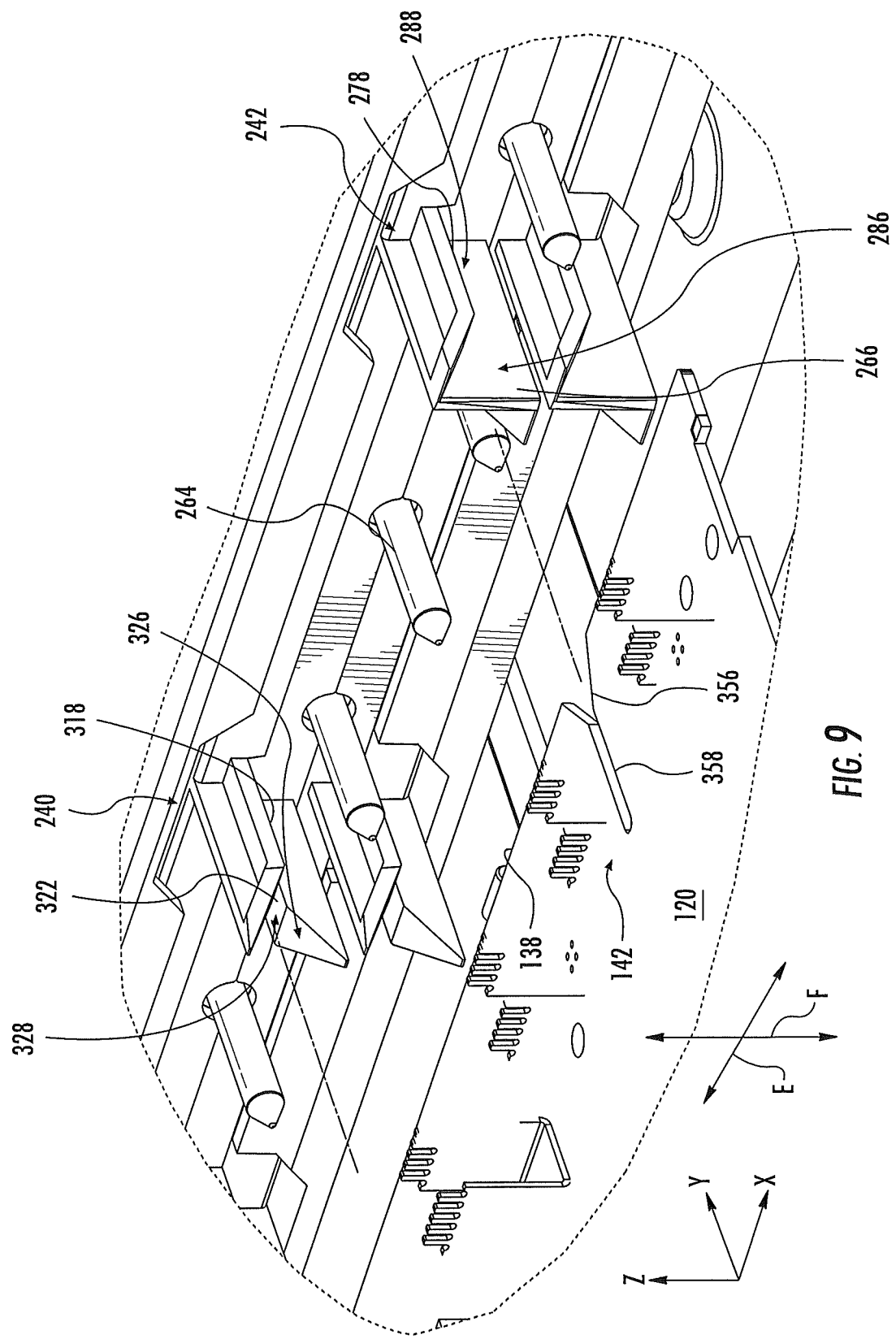
FIG. 9 is an enlarged, fragmentary, side perspective view of a portion of the second electrical component as indicated in FIG. 8.

Referring to FIG. 9, each notch or slot 142 is configured to receive the vertical rib 266 of a respective PCB engagement member 242. As the elongated or vertical rib 266 is received in the slot 142, the tapered segment 356 urges the PCB engagement member 242 to float or translate horizontally (arrow E) such that the vertical rib 266 is received in the constant width segment 358 and the PCB engagement member 242 is moved to the correct horizontal position. Adjacent pins are also horizontally aligned with their respective female sockets. Although the arrow E is referred to above as indicating a horizontal direction or path, it is emphasized that the arrow E may indicate a non-horizontal direction or path that is transverse to the longitudinal axis L shown in FIG. 1.

Moreover, as the elongated or vertical rib 266 is received in the slot 142, the edge 138 of the PCB 120 is received first in the chamfered pathway 286. Engagement of the PCB 120 and chamfered pathway 286 urges the PCB engagement member 242 to float or translate vertically (arrow F) such that the PCB engagement member 242 is moved to the correct vertical position. Adjacent pins are also vertically aligned with their respective female sockets. As the PCB is received in the straight pathway 288, the flat segment 278 of the PCB engagement member 242 is positioned over an upper surface of the PCB 120 and the flat segment 282 of the PCB engagement member 242 (FIGS. 4A and 4B) is positioned below a lower surface of the PCB 120, thereby helping to "lock" the PCB engagement member 242 (as well as adjacent pins 264) in the proper vertical position.

Referring to FIGS. 9 and 11, the PCB engagement member 240 engages the PCB 120 and is moved into the correct vertical position in a similar fashion. The PCB edge 138 is first received in the chamfered pathway 326 of the PCB engagement member 240. Engagement of the PCB 120 and the chamfered pathway 326 urges the PCB engagement member 240 to float or translate vertically (arrow F) into the correct vertical position. Adjacent pins are also vertically aligned with their respective female sockets. As the PCB 120 is received in the straight pathway 328, the flat segment 318 of the PCB engagement member 240 is positioned over an upper surface of the PCB 120 and the flat segment 322 of the PCB engagement member 240 is positioned below a lower surface of the PCB 120, thereby helping to "lock" the PCB engagement member 240 (and adjacent pins 264) in the proper vertical position. Although the arrow F is referred to above as indicating a vertical direction or path, it is emphasized that the arrow F may indicate a non-vertical direction or path that is transverse to the longitudinal axis L shown in FIG. 1 and perpendicular to the direction or path indicated by the arrow E.

The notches or slots 148 of the PCB 130 have similar structure to the notches or slots 142 of the PCB 120. As such, it will be appreciated that the geometry of the PCB engagement members 240, 242 and the PCB 130, as well as the "floating" nature of the PCB engagement members 240, 242, provide similar advantages to those described above.

Therefore, in the second position, the PCB engagement members 240, 242 engage the PCBs 120, 130. In some embodiments, the PCB engagement members 240, 242 fully engage the PCBs 120, 130 in the second position. That is, the vertical rib 266 of each PCB engagement member 242 may be received along the entire length of its corresponding slot (e.g., the entire length of the straight segment 358 of the slot 142 shown in FIG. 9). In some embodiments, the PCB engagement members 240, 242 partially engage the PCBs 120, 130 in the second position. In other words, the vertical rib 266 of each PCB engagement member 242 may be received along a portion of the length of its corresponding slot (e.g., between the distal end 352 and the intermediate point 354 of the slot 142 shown in FIG. 10).

Figures 12, 13:
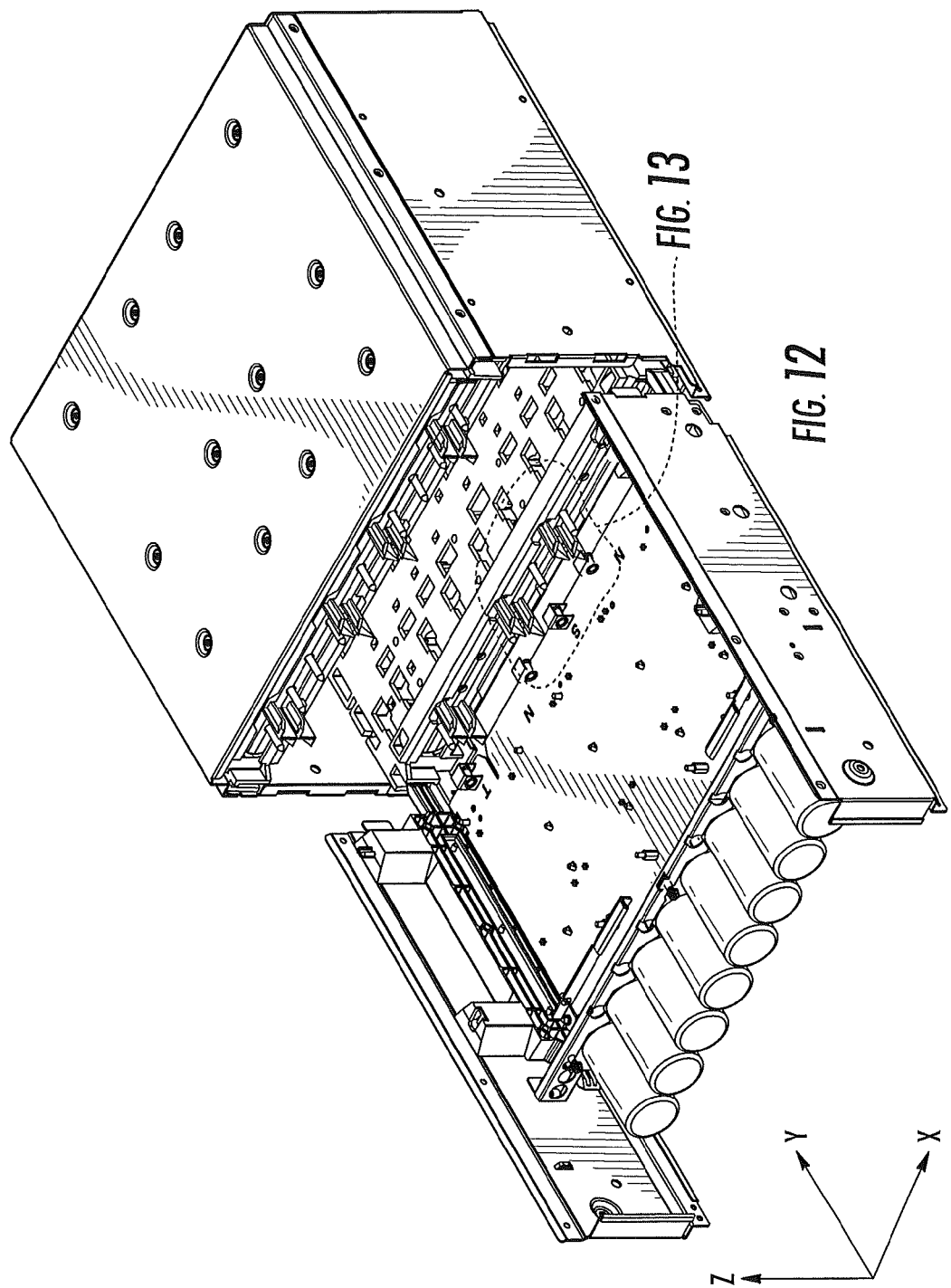
FIG. 12 is a partially transparent, top perspective view of the first and second electrical components of FIG. 1.
FIG. 13 is an enlarged, fragmentary, side perspective view of a portion of the second electrical component as indicated in FIG. 12.
Figure 13:
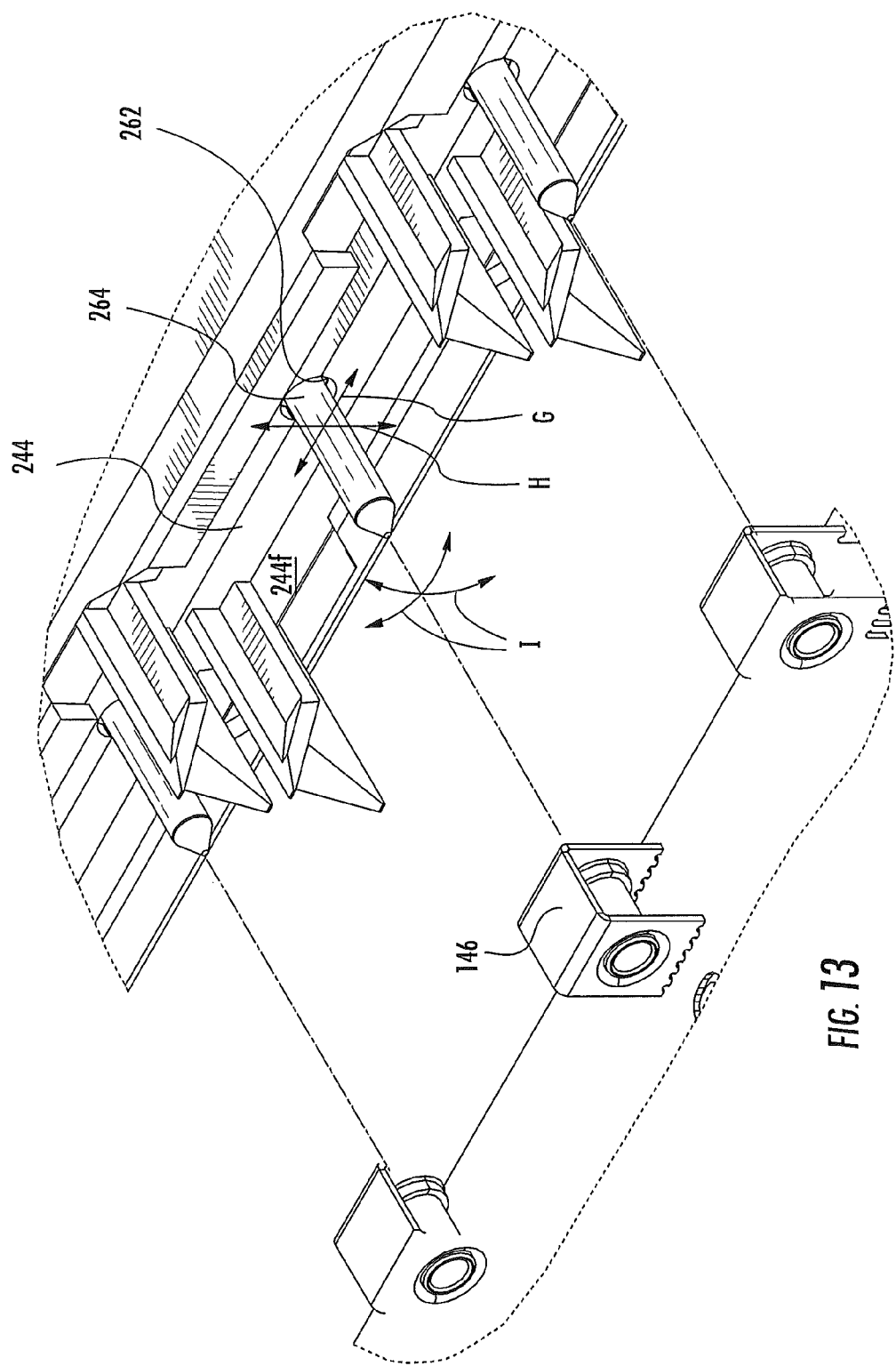

In the third position, the pins of the second electrical component 200 are received in the female sockets of the first electrical component 100. According to some embodiments, a third level of guidance is provided prior to the pins being completely received in the female sockets. Turning to FIGS. 12 and 13, each pin 264 may have a diameter that is smaller than the diameter of a respective aperture 262 through which the pin 264 extends. The pins may be configured to float or translate horizontally (arrow G), vertically (arrow H) and/or angularly (arrows I) to accommodate location and/or angular variances of the female sockets 146 (FIG. 13). A mechanism (not shown) may be provided on a rear side and/or an interior of the elongated member 244 to facilitate and/or limit the movement of the pins 264. The arrows G and H may indicate non-horizontal and/or non-vertical directions or paths that are perpendicular to one another, with each being transverse to the longitudinal axis L shown in FIG. 1. The arrows I may indicate that the pins 264 may float angularly relative to a front face 244f of the elongated member 244.

Figure 14:
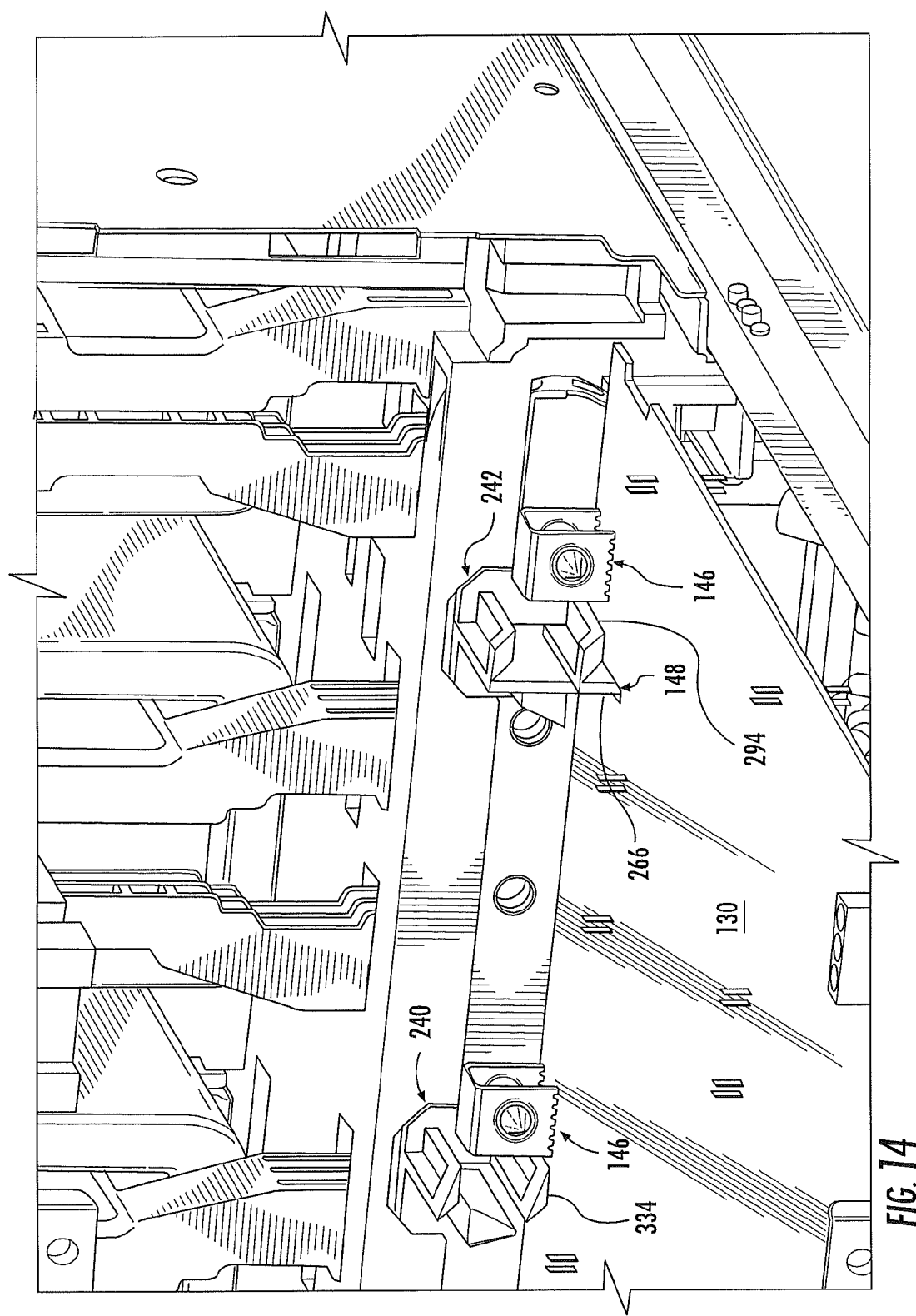
FIG. 14 is an enlarged, fragmentary, partially transparent perspective view illustrating the first electrical component connected with the second electrical component of FIG. 1.
Figure 15:
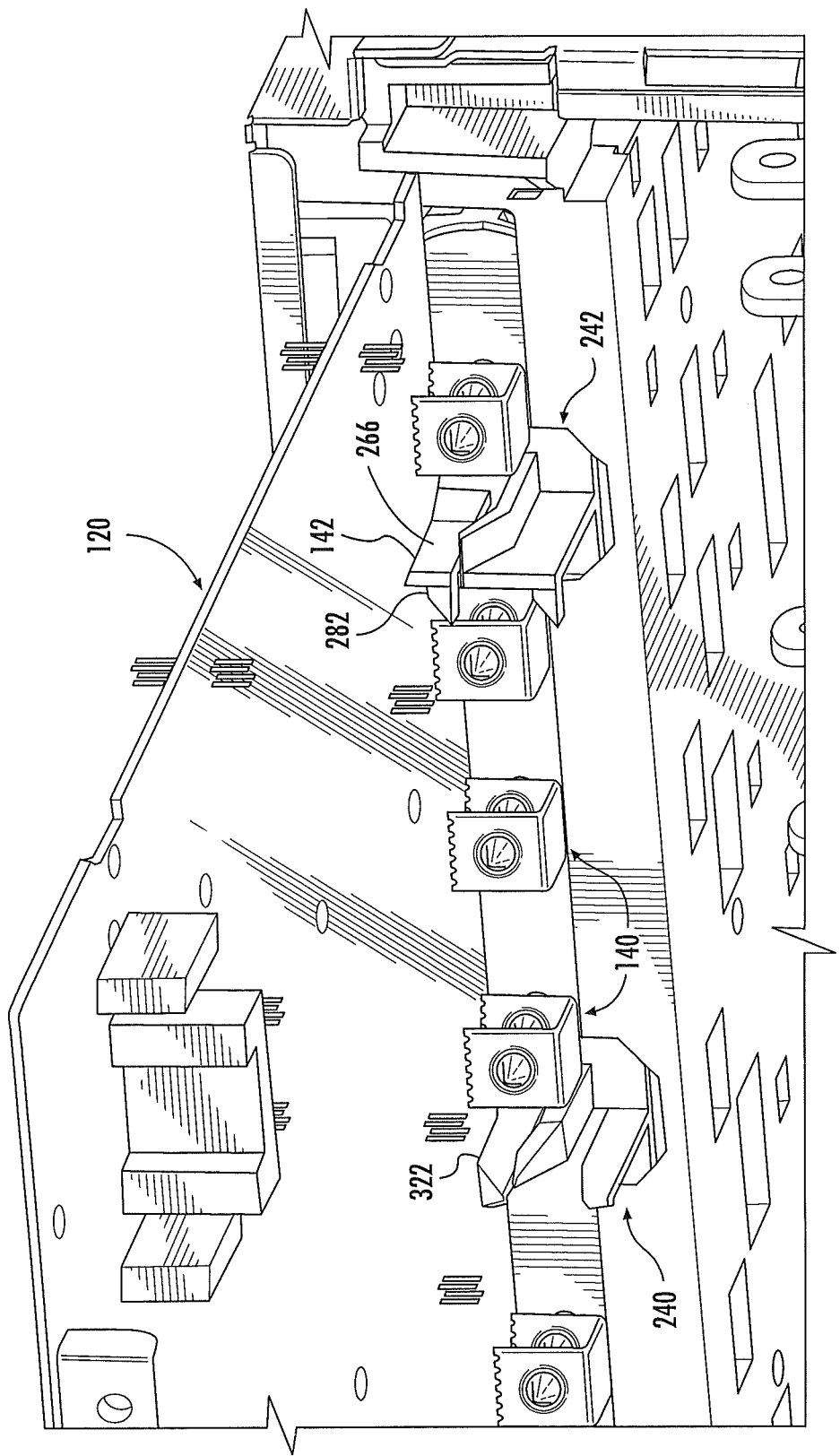
FIG. 15 is an enlarged, fragmentary, partially transparent perspective view illustrating the first electrical component connected with the second electrical component of FIG. 1.

FIGS. 14-15 illustrate the system in the third or fully engaged position. In FIG. 14, the PCB engagement members 240, 242 have engaged the PCB 130. The vertical rib 266 of the PCB engagement member 242 is at least partially received in the slot 148. The flat segment 294 of the PCB engagement member 242 is positioned above and/or against an upper surface of the PCB 130 and, although not shown, the flat segment 298 of the PCB engagement member 242 is positioned below and/or against a lower surface of the PCB 130. Similarly, the flat segment 334 of the PCB engagement member 240 is positioned above and/or against an upper surface of the PCB 130 and, although not shown, the flat segment 338 of the PCB engagement member 240 is positioned below and/or against a lower surface of the PCB 130. The pins 264 (not shown) are received in the female sockets 146, thereby facilitating an electrical connection between the first and second electrical components 100, 200.

In FIG. 15, the PCB engagement members 240, 242 have engaged the PCB 120. The vertical rib 266 of the PCB engagement member 242 is at least partially received in the slot 142. The flat segment 282 of the PCB engagement member 242 is positioned below and/or against a lower surface of the PCB 120 and, although not shown, the flat segment 278 of the PCB engagement member 242 is positioned above and/or against an upper surface of the PCB 120. Similarly, the flat segment 322 of the PCB engagement member 240 is positioned below and/or against a lower surface of the PCB 120 and, although not shown, the flat segment 318 of the PCB engagement member 240 is positioned above and/or against an upper surface of the PCB 120. The pins 264 (not shown) are received in the female sockets 140, thereby facilitating an electrical connection between the first and second electrical components 100, 200.

The above-described systems and methods provide certain advantages in aligning and connecting electrical components. Often, these components must be aligned, guided together and/or connected in tunnels or the like with little to no visual access during the alignment and connection process. The multi-step guidance systems and processes described herein allow an operator to more easily align and connect the electrical components in such environments. Further, the multi-step guidance systems and processes described herein can help combat problems associated with tolerance stack-up. The specialized geometries of the components and/or the floating nature the various members may also help alleviate concerns related to "blind guidance" and/or component tolerance stack-up.

As noted above, a guidance system 20 (FIG. 1) may be provided. The guidance system 15 may include the first alignment feature of the first electrical component 100 and/or the second alignment feature of the second electrical component 200. The guidance system 20 may include the PCB engagement members 240, 242. In some embodiments, the guidance system 20 includes the elongated member 244 and the PCB engagement members 240, 242 and/or the pins 264 extending therefrom. In some embodiments, the guidance system 20 includes the notches or slots 142, 148 of the PCBs 120, 130. The guidance system 20 may generally include any or all of the features disposed at the engagement end portions 110, 208 used to align, guide and/or connect the first and second electrical components 100, 200.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims, therefore, are to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

That which is claimed is:

1. An electrical component assembly, comprising:
a first electrical component having an engagement end portion, the first electrical component including a printed circuit board (PCB) mounted therein, the PCB having an edge at the engagement end portion and a plurality of female sockets positioned adjacent the edge, the first electrical component including an alignment feature at the engagement end portion; and
a second electrical component having an engagement end portion, the second electrical component including a plurality of PCB engagement members and a plurality of pins at the engagement end portion, the second electrical component including an alignment feature at the engagement end portion;
wherein the first and second electrical components are configured to be aligned and connected by progressively bringing together the engagement end portion of the first electrical component and the engagement end portion of the second electrical component, wherein:
in a first position, the engagement end portion of the first electrical component and the engagement end portion of the second electrical component are spaced apart a first distance and the alignment features of the first and second electrical components are engaged;
in a second position, the engagement end portion of the first electrical component and the engagement end portion of the second electrical component are spaced apart a second distance that is less than the first distance and the PCB engagement members engage the PCB; and
in a third position, the engagement end portion of the first electrical component and the engagement end portion of the second electrical component are spaced apart a third distance that is less than the second distance and the female sockets receive the pins.

2. The assembly of claim 1, comprising:
a first PCB mounted at a top portion of the first electrical component, the first PCB including a plurality of female sockets mounted to a bottom surface thereof;
a second PCB mounted at a bottom portion of the first electrical component, the second PCB including a plurality of female sockets mounted to a top surface thereof;
a first elongated member having a plurality of PCB engagement members slidably mounted in a slot at a top portion of the first electrical component, the first elongated member including a plurality of apertures with a pin extending through at least some of the apertures; and
a second elongated member mounted in a slot at a bottom portion of the first electrical component, the second elongated member including a plurality of apertures with a pin extending through at least some of the apertures;
wherein:
in the second position, the PCB engagement members of the first elongated member engage the first PCB and the PCB engagement members of the second elongated member engage the second PCB; and
in the third position, the pins extending through the first elongated member are received in the female sockets of the first PCB and the pins extending through the second elongated member are received in the female sockets of the second PCB.

3. The assembly of claim 1, wherein:
the first electrical component alignment feature comprises a plurality of tabs extending outwardly away from a first side portion of the engagement end portion and a plurality of tabs extending outwardly away from a second, opposed side portion of the engagement end portion; and
the second electrical component alignment feature comprises a plurality of recesses at a first side portion of the engagement end portion and a plurality of recesses at a second, opposed side portion of the engagement end portion, each recess configured to receive a corresponding tab of the first electrical component.

4. The assembly of claim 3, wherein:
at least one recess on each side portion of the second electrical component engagement end portion has a width greater than a width of the corresponding tab of the first electrical component; and
at least one recess on each side portion of the second electrical component engagement end portion has a height greater than a height of the corresponding tab of the first electrical component.

5. The assembly of claim 1, wherein the PCB engagement members are configured to translate at the engagement end portion in a first direction and in a second direction that is perpendicular to the first direction.

6. The assembly of claim 5, wherein the plurality of PCB engagement members are provided on an elongated member received in a slot at the engagement end portion of the second electrical component, wherein the elongated member is slidable within the slot.

7. The assembly of claim 6, wherein the elongated member includes a plurality of apertures with each of the plurality of pins extending through a respective aperture.

8. The assembly of claim 7, wherein each pin has a diameter that is less than a diameter of its respective aperture, wherein each pin is configured to translate within the aperture, and wherein each pin is configured to float angularly relative to a front surface of the elongated member.

9. The assembly of claim 5, wherein:
the PCB includes first and second spaced-apart slots extending inwardly from a proximal end at the edge of the PCB to a distal end within the PCB, each slot including a first segment having an inwardly tapered opening from the proximal end to an intermediate point between the proximal end and the distal end, each slot also including a second segment having substantially constant opening size and extending from the intermediate point to the distal end; and
the plurality of PCB engagement members includes a first PCB engagement member and a second PCB engagement member, each one having an elongated rib sized and configured to fit within at least a portion of the second segment of the slot when the first and second electrical components are in the second position.

10. The assembly of claim 9, wherein the first segment of each slot is configured to urge the elongated rib of a respective PCB engagement member into the second segment as the first and second electrical components are moved from the first position to the second position.

11. The assembly of claim 9, wherein the first and second PCB engagement members each include first and second ribs extending away from opposite sides of the elongated rib, each of the first and second ribs including a flat segment, and wherein the first and second PCB engagement members are configured such that the flat segment of one of the first and second ribs resides on one side of the PCB and the flat segment of the other one of the first and second ribs resides on an opposite side of the PCB when the first and second electrical components are in the second position.

12. The assembly of claim 11, wherein each of the first and second ribs extends from a proximal end at the engagement end portion of the second electrical component to a distal end, wherein the flat segment extends from the proximal end to an intermediate point between the proximal and distal ends, and wherein each of the first and second ribs further includes a chamfered segment extending from the intermediate point to the distal end.

13. The assembly of claim 12, wherein the first and second ribs are spaced-apart so as to define a chambered pathway between the chamfered segments and a straight pathway between the flat segments, the first and second ribs being spaced-apart a substantially constant distance along the straight pathway, at least a portion of the straight pathway configured to receive the PCB in the second position.

14. The assembly of claim 13, wherein the chamfered pathway is configured to receive the PCB and urge the PCB engagement member into position such that the PCB is received in at least a portion of the straight pathway as the first and second electrical components are moved from the first position to the second position.

15. The assembly of claim 9, wherein the plurality of PCB engagement members includes a third PCB engagement member positioned between the first and second PCB engagement members, the third PCB engagement member having first and second ribs configured to receive the PCB therebetween.

16. The assembly of claim 15, wherein each of the first and second ribs of the third PCB engagement member extends from a proximal end at the engagement end portion of the second electrical component to a distal end, each rib including a flat segment extending from the proximal end to an intermediate point between the proximal and distal ends, each rib further including a chamfered segment extending from the intermediate point to the distal end.

17. The assembly of claim 16, wherein the first and second ribs of the third PCB engagement member are spaced-apart so as to define a chamfered pathway between the chamfered segments and a straight pathway between the flat segments, the first and second ribs being spaced-apart a substantially constant distance along the straight pathway, at least a portion of the straight pathway configured to receive the PCB in the second position.

18. The assembly of claim 17, wherein, in the second position, the flat segment of one of the first and second ribs of the third PCB engagement member resides on one side the PCB and the flat segment of the other one of the first and second ribs resides on an opposite side of the PCB.

19. The assembly of claim 17, wherein the third PCB engagement member chamfered pathway is configured to receive the PCB and urge the third PCB engagement member into position such that the PCB is received in at least a portion of the straight pathway as the first and second electrical components are moved from the first position to the second position.

20. A method of aligning and connecting electrical components, the method comprising:
providing:
a first electrical component having an engagement end portion, the first electrical component including a PCB mounted therein, the PCB having an edge at the engagement end portion and a plurality of female sockets adjacent the edge, the first electrical component including an alignment feature at the engagement end portion; and
a second electrical component having an engagement end portion, the second electrical component including a plurality PCB engagement members and a plurality of pins at the engagement end portion, the second electrical component including an alignment feature at the engagement end portion;
aligning the first and second electrical components by positioning the engagement end portion of the first electrical component and the engagement end portion of the second electrical component apart a first distance such that the alignment features of the first and second electrical components are engaged with one another;
further aligning the first and second electrical components by positioning the engagement end portion of the first electrical component and the engagement end portion of the second electrical component apart a second distance that is less than the first distance such that the PCB engagement members engage the edge of the PCB; and
electrically connecting the first and second electrical components by positioning the engagement end portion of the first electrical component and the engagement end portion of the second electrical component apart a third distance that is less than the second distance such that the pins are received in the female sockets.

21. A system for aligning and connecting electrical components, the system comprising:
a first electrical component having an engagement end portion, the first electrical component including a PCB mounted therein, the PCB having an edge at the engagement end portion and a plurality of female sockets adjacent the edge; and
a second electrical component having an engagement end portion;
a guidance system for aligning and connecting the first and second electrical components, the system comprising:
a plurality of PCB engagement members and a plurality of pins mounted to an elongated member at the second electrical component engagement end portion, the elongated member configured to translate at the engagement end portion in a first direction and a second direction that is perpendicular to the first direction, each PCB engagement member including a chamfered pathway configured to receive the PCB and urge the PCB engagement member in the first and/or the second direction to substantially align the pins and the female sockets.

22. The system of claim 21, wherein the guidance system further comprises a pair of slots on the PCB, each slot including an inwardly tapering segment at the PCB edge, wherein a first and second of the PCB engagement members each include an elongated rib, the tapering segment of each PCB slot configured to receive the elongated rib of a respective one of the first and second PCB engagement members and urge the PCB engagement member in the first and/or second direction to substantially align the pins and female sockets.

* * * * *